United States Patent
Arai

(10) Patent No.: US 8,321,816 B2
(45) Date of Patent: Nov. 27, 2012

(54) PROGRAM STORAGE MEDIUM AND METHOD FOR DETERMINING EXPOSURE CONDITION AND MASK PATTERN

(75) Inventor: Tadashi Arai, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/276,410

(22) Filed: Oct. 19, 2011

(65) Prior Publication Data

US 2012/0096413 A1   Apr. 19, 2012

(30) Foreign Application Priority Data

Oct. 19, 2010   (JP) ................................. 2010-234915

(51) Int. Cl.
   *G06F 17/50*   (2006.01)
(52) U.S. Cl. ................ 716/50; 716/51; 716/52; 716/53; 716/54; 716/55
(58) Field of Classification Search .................... 716/50, 716/51, 52, 53, 54, 55
   See application file for complete search history.

(56) References Cited

U.S. PATENT DOCUMENTS

| | | | |
|---|---|---|---|
| 6,536,032 B1 * | 3/2003 | Tanaka et al. | 716/51 |
| 6,563,566 B2 | 5/2003 | Rosenbluth et al. | |
| 7,212,275 B2 * | 5/2007 | Ohtsuki | 355/67 |
| 7,405,803 B2 * | 7/2008 | Shimizu et al. | 355/52 |
| 2008/0248403 A1 * | 10/2008 | Yu et al. | 430/5 |

FOREIGN PATENT DOCUMENTS

JP   2011-095729 A   5/2011

OTHER PUBLICATIONS

J.A. Nelder and R. Mead; "A Simplex Method for Function Minimization"; Computer Journal, vol. 7, p. 308-313, 1965.

* cited by examiner

*Primary Examiner* — Jack Chiang
*Assistant Examiner* — Brian Ngo
(74) *Attorney, Agent, or Firm* — Rossi, Kimms & McDowell LLP

(57) ABSTRACT

A method of determining an exposure condition and a mask pattern includes: setting the exposure condition and the mask pattern; temporarily determining the mask pattern using a first evaluation function describing indices of quality of an image of the mask pattern, using the set exposure condition; calculating a value of a second evaluation function describing indices of quality of the image of the mask pattern, using the temporarily determined mask pattern and the set exposure condition; changing the exposure condition and the mask pattern based on the value of the calculated second evaluation function; and judging whether to execute a process of repeating the temporarily determining step and the calculating step. In the judging step, the mask pattern temporarily determined in the latest second step, and the exposure condition changed in the latest fourth step are determined as the mask pattern and the exposure condition, respectively.

10 Claims, 9 Drawing Sheets

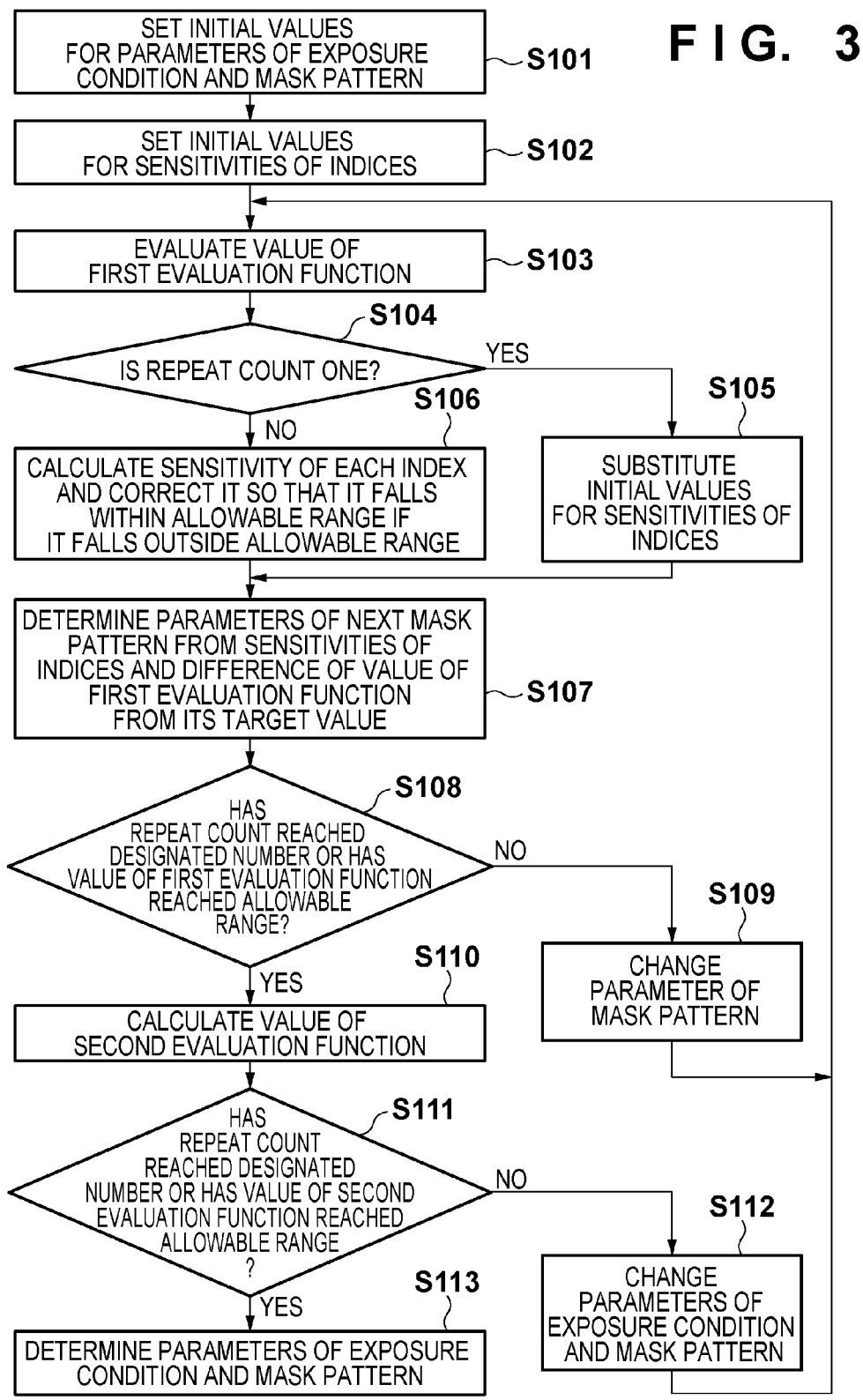

PROGRAM STORAGE MEDIUM AND METHOD FOR DETERMINING EXPOSURE CONDITION AND MASK PATTERN

BACKGROUND OF THE INVENTION

1. Field of the Invention

The present invention relates generally to a lithography technique for fabricating, for example, a semiconductor integrated circuit, a liquid crystal panel, and an image sensor and, more particularly, to a program storage medium and a method for determining the exposure condition and the mask pattern.

2. Description of the Related Art

With the recent advances in micropatterning of semiconductor devices, it has become difficult for an exposure apparatus to transfer (resolve) a desired pattern. Hence, to keep pace with the miniaturization of semiconductor devices, the exposure apparatus uses resolution enhanced technologies such as modified illumination and optical proximity correction (OPC) to optimize the mask pattern or the illumination configuration (effective light source distribution) used to illuminate a mask. The illumination configuration (effective light source distribution) is a light intensity distribution formed on the pupil plane of an illumination optical system, and also serves as the angular distribution of light which illuminates a mask. To optimize the illumination configuration, first, a layout pattern (target pattern) for a device, an evaluation position for a transfer pattern (optical image), and an evaluation value (for example, the size, the DOF, or the exposure margin) at the evaluation position are set. Next, the transfer pattern is calculated while changing the illumination configuration to obtain the evaluation value at the evaluation position on the transfer pattern. The transfer pattern calculation and the evaluation value obtaining are repeated until the obtained evaluation value reaches an allowable range or the number of changes in illumination configuration reaches a predetermined number. The illumination configuration is numerically represented by, for example, a function having inner σ and outer σ as its parameters (variables), which are optimized using, for example, the Monte Carlo method in annular illumination having a predetermined intensity. Even when the same mask pattern is used, the transfer pattern varies with a variation in illumination configuration, so the transfer pattern shifts from the target pattern upon changing the illumination configuration. Therefore, OPC is necessary to match the transfer pattern with the target pattern. OPC is done every time the illumination configuration is changed or the illumination configuration is changed by a predetermined amount.

U.S. Pat. No. 6,563,566 proposes a technique of setting a pattern to be formed on a substrate (wafer), and calculating the mask pattern and illumination configuration optimized by a mathematical approach. The technique disclosed in U.S. Pat. No. 6,563,566 analytically calculates solutions (mask pattern and illumination configuration) instead of repeated computation. Although the technique disclosed in U.S. Pat. No. 6,563,566 does not adopt OPC, the pattern to be formed on the substrate (for example, a wafer) and the optimized mask pattern are different from each other, so this technique can be said to be an illumination configuration optimization technique including mask pattern correction in a broad sense. The technique disclosed in U.S. Pat. No. 6,563,566 has a merit that it analytically calculates solutions, but requires not only limitation of the evaluation value to the tilt of an optical image but also limitation of the type of pattern to be formed on the substrate to one specific type. In this manner, the technique described in U.S. Pat. No. 6,563,566 is impractical because it has a demerit that it provides only a small number of degrees of freedom.

Unfortunately, it has become impossible for the prior art techniques relating to optimization of the mask pattern and the illumination configuration to form patterns that are rapidly becoming finer with sufficient accuracy. This is because the mask pattern and the illumination configuration are optimized separately, that is, they are not optimized simultaneously. As described above, OPC depends on the illumination configuration, and is therefore generally performed after the illumination configuration is determined (optimized). However, the mask pattern deforms upon OPC, so the illumination configuration determined before OPC may no longer be optimum after OPC.

SUMMARY OF THE INVENTION

The present invention provides a program storage medium and a method which can determine an exposure condition and a mask pattern that attain good imaging performance.

The present invention in its first aspect provides a program storage medium for causing a computer to execute a method of determining an exposure condition and a mask pattern used for an exposure apparatus which projects the mask pattern onto a substrate via a projection optical system to expose the substrate, the method including: a first step of setting the exposure condition and the mask pattern; a second step of temporarily determining the mask pattern using a first evaluation function describing indices of quality of an image of the mask pattern formed on the substrate by the projection optical system, using the exposure condition set in the first step; a third step of calculating a value of a second evaluation function describing indices of quality of the image of the mask pattern formed on the substrate by the projection optical system, using the mask pattern temporarily determined in the second step, and the exposure condition set in the first step; a fourth step of changing the exposure condition and the mask pattern based on the value of the second evaluation function calculated in the third step; and a fifth step including a process of judging whether to execute a process of repeating the second step and the third step upon defining, as initial values, the exposure condition and the mask pattern changed in the fourth step, wherein in the fifth step, if a repeat count of the second step and the third step has not reached a predetermined number, and the value of the second evaluation function calculated in the latest third step has not reached an allowable range, it is judged that the process of repeating the second step and the third step is to be executed; or if the repeat count of the second step and the third step has reached the predetermined number or the value of the second evaluation function calculated in the latest third step has reached the allowable range, it is judged that the process of repeating the second step and the third step is not to be executed, and the mask pattern temporarily determined in the latest second step, and the exposure condition changed in the latest fourth step are determined as the mask pattern and the exposure condition, respectively.

The present invention in its second aspect provides a program storage medium for causing a computer to execute a method of determining an exposure condition and a mask pattern used for an exposure apparatus which projects the mask pattern onto a substrate via a projection optical system to expose the substrate, the method including: a first step of setting the exposure condition and the mask pattern; a second step of temporarily determining the exposure condition using a first evaluation function describing indices of quality of an image of the mask pattern formed on the substrate by the projection optical system, using the mask pattern set in the first step; a third step of calculating a value of a second evaluation function describing indices of quality of the image of the mask pattern formed on the substrate by the projection optical system, using the mask pattern set in the first step, and the exposure condition temporarily determined in the second step; a fourth step of changing the exposure condition and the mask pattern based on the value of the second evaluation function calculated in the third step; and a fifth step including a process of judging whether to execute a process of repeating the second step and the third step upon defining, as initial values, the exposure condition and the mask pattern changed in the fourth step, wherein in the fifth step, if a repeat count of the second step and the third step has not reached a predetermined number, and the value of the second evaluation function calculated in the latest third step has not reached an allowable range, it is judged that the process of repeating the second step and the third step is to be executed; or if the repeat count of the second step and the third step has reached the predetermined number or the value of the second evaluation function calculated in the latest third step has reached the allowable range, it is judged that the process of repeating the second step and the third step is not to be executed, and the exposure condition temporarily determined in the latest second step, and the mask pattern changed in the latest fourth step are determined as the exposure condition and the mask pattern, respectively.

The present invention in its third aspect provides a method of determining, using a computer, an exposure condition and a mask pattern used for an exposure apparatus which projects the mask pattern onto a substrate via a projection optical system to expose the substrate, comprising: a first step of setting the exposure condition and the mask pattern; a second step of temporarily determining the mask pattern using a first evaluation function describing indices of quality of an image of the mask pattern formed on the substrate by the projection optical system, using the exposure condition set in the first step; a third step of calculating a value of a second evaluation function describing indices of quality of the image of the mask pattern formed on the substrate by the projection optical system, using the mask pattern temporarily determined in the second step, and the exposure condition set in the first step; a fourth step of changing the exposure condition and the mask pattern based on the value of the second evaluation function calculated in the third step; and a fifth step including a process of judging whether to execute a process of repeating the second step and the third step upon defining, as initial values, the exposure condition and the mask pattern changed in the fourth step, wherein in the fifth step, if a repeat count of the second step and the third step has not reached a predetermined number, and the value of the second evaluation function calculated in the latest third step has not reached an allowable range, it is judged that the process of repeating the second step and the third step is to be executed; or if the repeat count of the second step and the third step has reached the predetermined number or the value of the second evaluation function calculated in the latest third step has reached the allowable range, it is judged that the process of repeating the second step and the third step is not to be executed, and the mask pattern temporarily determined in the latest second step, and the exposure condition changed in the latest fourth step are determined as the mask pattern and the exposure condition, respectively.

The present invention in its fourth aspect provides a method of determining, using a computer, an exposure condition and a mask pattern used for an exposure apparatus which projects the mask pattern onto a substrate via a projection optical system to expose the substrate, comprising: a first step of setting the exposure condition and the mask pattern; a second step of temporarily determining the exposure condition using a first evaluation function describing indices of quality of an image of the mask pattern formed on the substrate by projecting the mask pattern onto the substrate to expose the substrate under the exposure condition, using the mask pattern set in the first step; a third step of calculating a value of a second evaluation function describing indices of quality of the image of the mask pattern formed on the substrate by the projection optical system, using the mask pattern set in the first step, and the exposure condition temporarily determined in the second step; a fourth step of changing the exposure condition and the mask pattern based on the value of the second evaluation function calculated in the third step; and a fifth step including a process of judging whether to execute a process of repeating the second step and the third step upon defining, as initial values, the exposure condition and the mask pattern changed in the fourth step, wherein in the fifth step, if a repeat count of the second step and the third step has not reached a predetermined number, and the value of the second evaluation function calculated in the latest third step has not reached an allowable range, it is judged that the process of repeating the second step and the third step is to be executed; or if the repeat count of the second step and the third step has reached the predetermined number or the value of the second evaluation function calculated in the latest third step has reached the allowable range, it is judged that the process of repeating the second step and the third step is not to be executed, and the exposure condition temporarily determined in the latest second step, and the mask pattern changed in the latest fourth step are determined as the exposure condition and the mask pattern, respectively.

Further features of the present invention will become apparent from the following description of exemplary embodiments with reference to the attached drawings.

BRIEF DESCRIPTION OF THE DRAWINGS

FIG. 3 is a flowchart of an optimization method according to the first embodiment;

DESCRIPTION OF THE EMBODIMENTS

Figure 8:
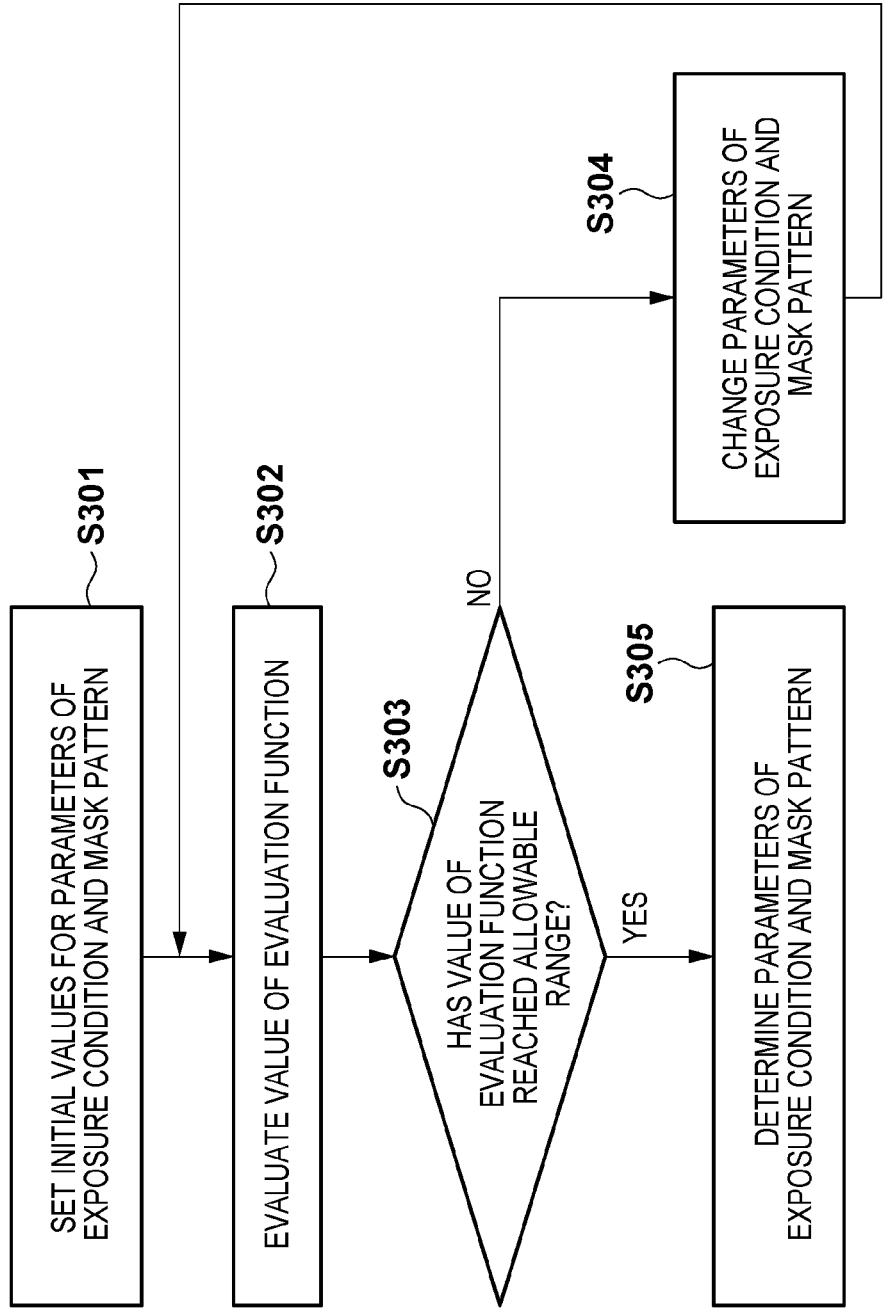
FIG. 8 is a flowchart of the optimization method according to the prior invention.

The applicant of the present invention further developed the prior art technique described in U.S. Pat. No. 6,563,566, and proposed a method of establishing a function describing the exposure condition and the mask pattern to simultaneously optimize and determine the exposure condition and mask pattern used for an exposure apparatus (Japanese Patent Application No. 2010-207153). A method according to the prior invention will be described with reference to FIG. 8. In the method according to the prior invention, in step S301, a computer (or, for example, a CPU or an MPU) sets initial values for the parameters of the exposure condition and mask pattern. In step S302, the computer evaluates an evaluation function describing indices of a plurality of evaluation items in each evaluation portion. The indices mean herein indices associated with the quality of an image created on a substrate by projecting the mask pattern onto the substrate via a projection optical system to expose the substrate. In step S303, the computer judges whether the value of the evaluation function has reached an allowable range. If it is judged in step S303 that the value of the evaluation function has not reached the allowable range, the computer changes the parameters of the exposure condition and mask pattern in step S304, and executes a process of repeating step S302. If it is judged in step S303 that the value of the evaluation function has reached the allowable range, the computer determines, as the parameters of the exposure condition and mask pattern, the parameters of the exposure condition and mask pattern changed in step S304 of the latest loop, and ends the sequence.

Figure 1A:
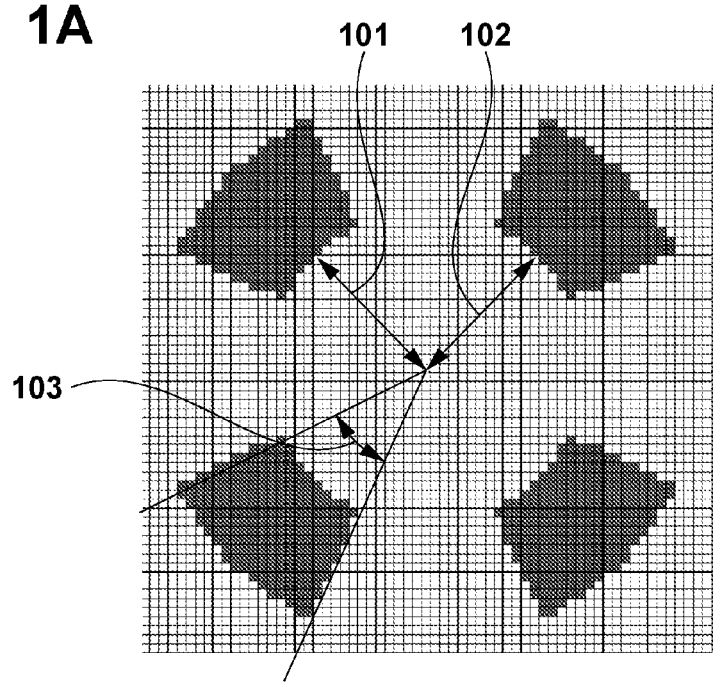
FIGS. 1A and 1B are views showing an effective light source and a mask pattern, respectively.

FIG. 1A shows the parameters of the exposure condition and mask pattern in the method according to the prior invention. Parameters defined in a diagonal quadrupole having an outer sigma 101, an inner sigma 102, and an aperture angle 103, shown in FIG. 1A, were used as those of the illumination configuration (effective light source distribution). The numerical aperture (NA) was also changed as a parameter of the exposure condition. The parameters of the exposure condition change in the following ranges: the NA changes from 0.60 to 0.86; the outer sigma changes from 0.70 to 0.95; the sigma ratio (inner sigma/outer sigma) changes from 0.50 to 0.80; and the aperture angle changes from 20° to 90°.

Figure 1B:
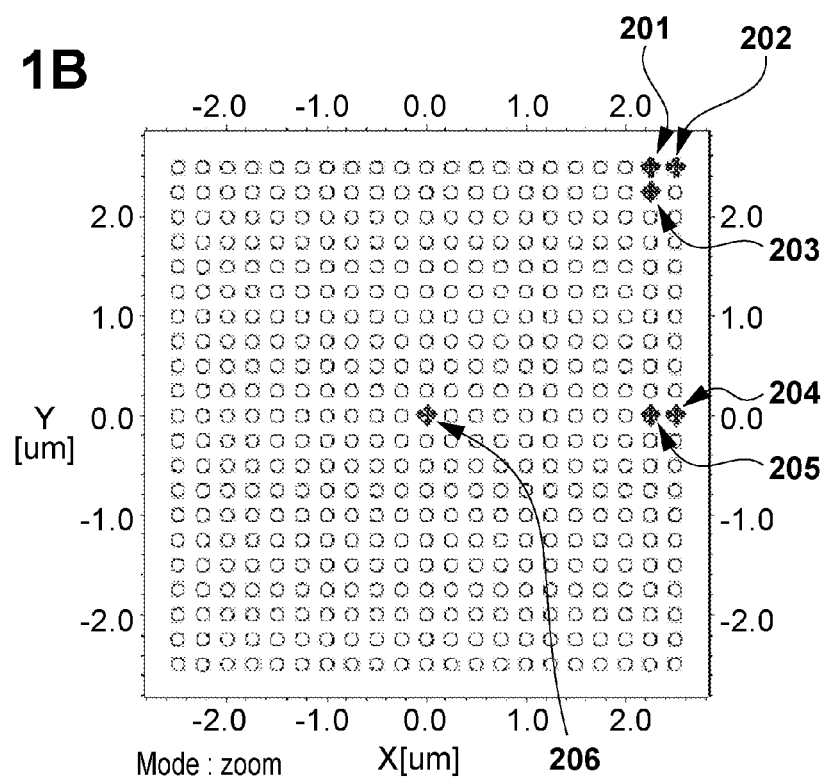

A pattern including 21×21 densely populated holes having a line width of 125 nm and a pitch of 250 nm, shown in FIG. 1B, was used as the mask pattern. A total of 12 evaluation portions: the vertical and horizontal line widths of six holes 201 to 206 shown in FIG. 1B were defined. The parameters of the mask pattern change in the following ranges: the line width (on the scale of the image plane) of the mask pattern changes from 90 to 180 nm; and the amount of image shift (on the scale of the image plane) changes from −5 to +5 nm.

Table 1 shows the indices and the thresholds of their allowable ranges for imaging performance described by an evaluation function used to optimize both the exposure condition and the mask pattern.

introduced aiming at eliminating an error if "Value" becomes zero, and is 1.0e-10. The evaluation function is a function expressed by the sum of the variables presented in "Expression" of Table 1: the line width error RMS, the minimum value of the normalized image log slope (NILS), the exposure margin, the image shift, the NILS depth of focus, the common exposure margin depth of focus, the worst value of the exposure margin depth of focus, and the common depth of focus. The line width error is an error of the line width of a pattern formed on the image plane (on the substrate) of the projection optical system. The exposure margin is an index indicating the rate of change in line width of the pattern with respect to a change in amount of exposure. The image shift is the amount of shift in pattern formed on the substrate or that in edge of the pattern.

Figure 2A:
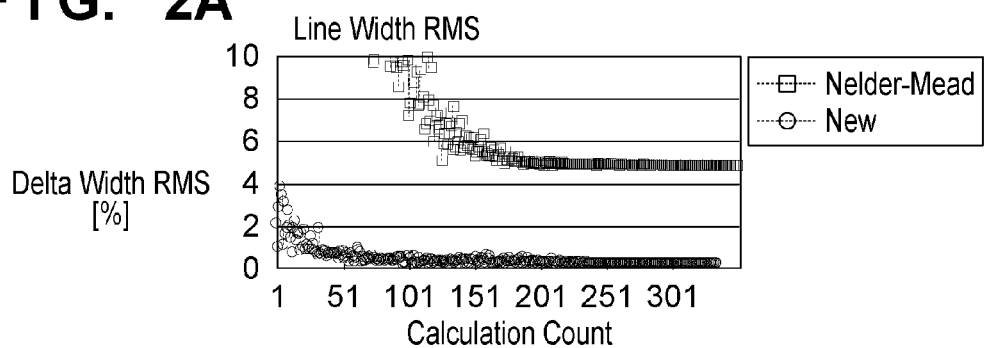
FIGS. 2A to 2G are graphs showing the optimization results obtained by a method according to the prior invention and a method according to the first embodiment.
Figure 2B:
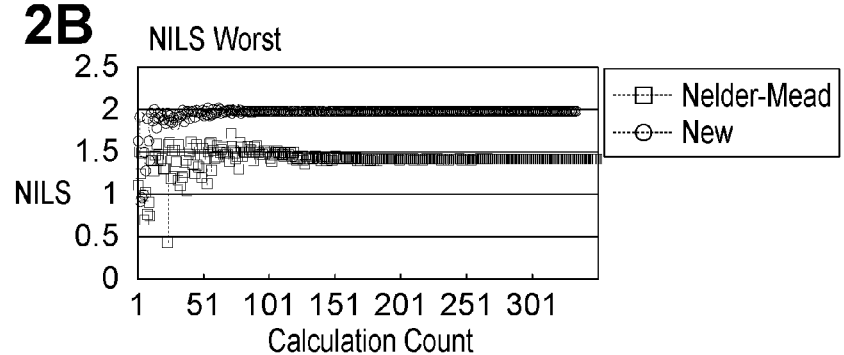
Figure 2C:
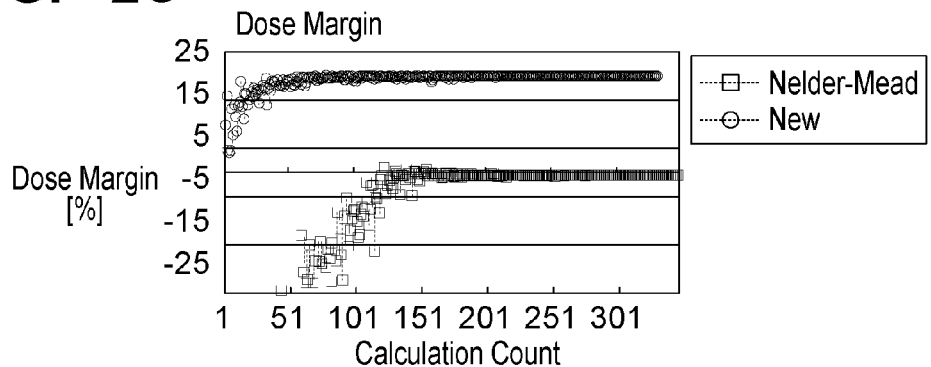
Figure 2D:
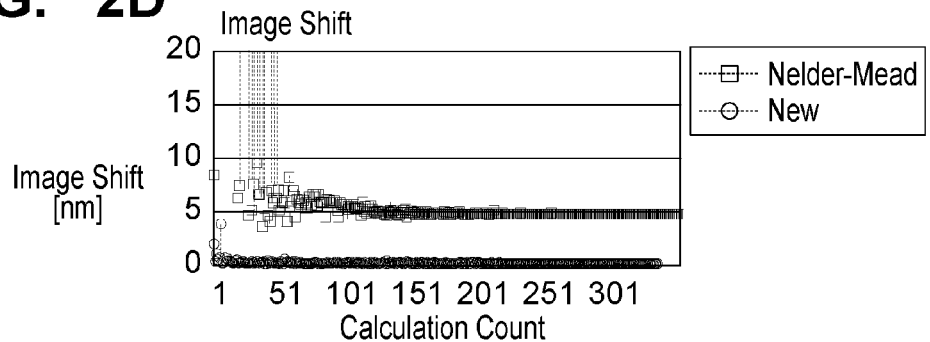
Figure 2E:
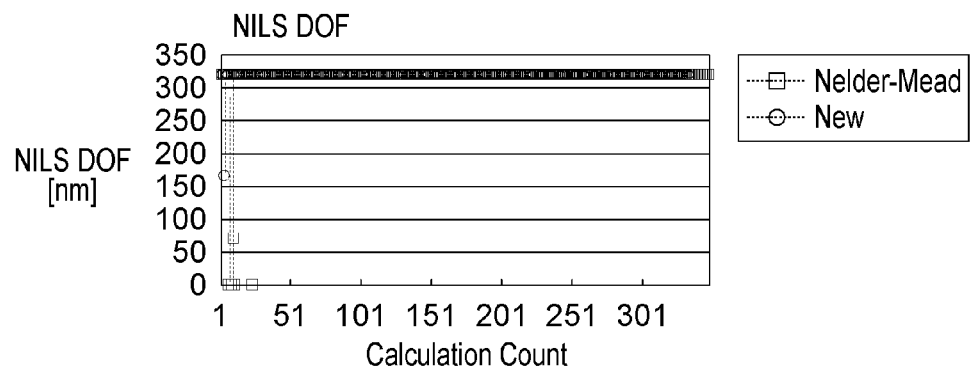
Figure 2F:
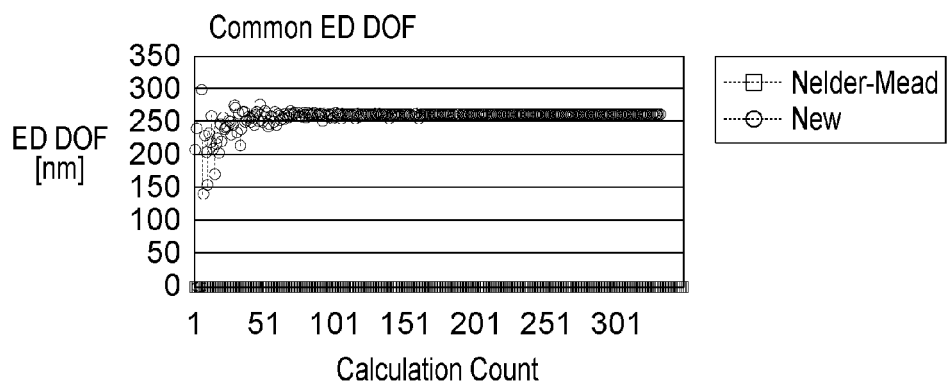
Figure 2G:
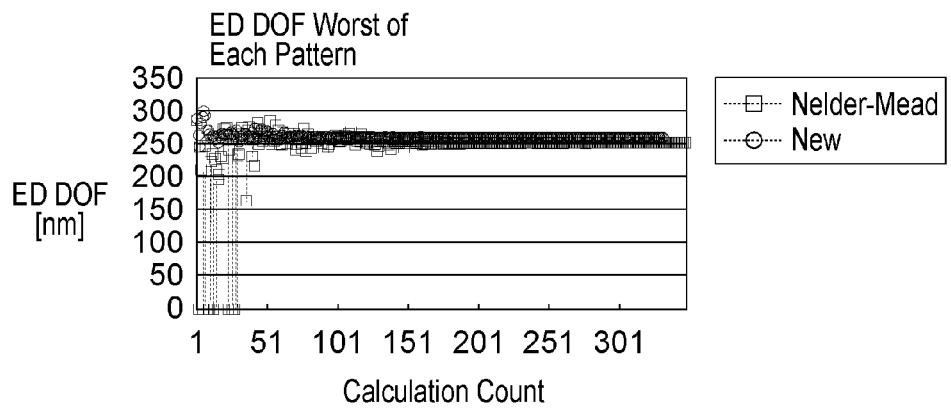

Referring to FIGS. 2A to 2G, square marks indicate the optimization results of the exposure condition and mask pattern in the prior invention. The optimization method according to the prior invention could not produce a predetermined imaging performance for most indices. A predetermined imaging performance could not be obtained for seven indices: the line width error (FIG. 2A), the minimum value of the NILS (FIG. 2B), the exposure margin (FIG. 2C), the image shift (FIG. 2D), the NILS depth of focus (FIG. 2E), the common exposure margin depth of focus (FIG. 2F), and the worst value of the exposure margin depth of focus (FIG. 2G). Also, in this method according to the prior invention, the parameters of the exposure condition and mask pattern, including those which exert little influence on the target imaging performance, were optimized simultaneously, so the solution often converged before reaching the target imaging performance. In contrast to this, the present invention separately provides a sequence of optimizing important parameters to avoid convergence to a local solution, thereby improving the performance of optimization that can be reached.

The method according to the present invention will be described below. In the first embodiment, the line width and the image shift in each evaluation portion are assumed as important indices (first evaluation function), so the parameters of the mask pattern exert a great influence on the first evaluation function. On the other hand, in the second embodiment, the NILS width in each evaluation portion is assumed as an important index (first evaluation function), and the light intensity of each element of the effective light source, that is, a parameter of the exposure condition is assumed as a parameter which exerts a great influence on the first evaluation function. In the first and second embodiments, the Nelder-Mead method is used as an algorithm which simultaneously optimizes the exposure condition and the mask pattern. The

TABLE 1

| Evaluation Index | Maximization/ Minimization | Sign of Value | Expression | Tolerance |
| --- | --- | --- | --- | --- |
| Line Width Error RMS | Minimization | Positive | +Value/Tol | 1 [%] |
| Minimum Value of NILS | Maximization | Positive | +Tol/(Value + error) | 1.5 |
| Exposure Margin | Maximization | Positive/Negative | −Value/Tol | 15 [%] |
| Worst Value of Image Shift | Absolute Value Minimization | Positive | +Value/Tol | 1 [nm] |
| NILS Depth of Focus | Maximization | Positive | +Tol/(Value + error) | 250 [nm] |
| Common Exposure Margin Depth of Focus | Maximization | Positive | +Tol/(Value + error) | 250 [nm] |
| Exposure Margin Depth of Focus | Maximization | Positive | +Tol/(Value + error) | 250 [nm] |

Note that "Value" is the index of an evaluation target, "Tol" is the threshold of the allowable range, "error" is a small value Nelder-Mead method is also called the down-hill simplex method, which is explained in detail in J. A. Nelder and R.

Mead, Computer Journal, Vol. 7, p. 308, 1965. Although the depth of focus is included in the indices in the first and second embodiments, it may always take zero in a certain variable region and therefore cannot have a slope upon changing the variables. In such a case, an optimization method such as the steepest descent method which computes a commonly used slope to search for an optimum solution is inapplicable. However, the Nelder-Mead method searches for an optimum solution using a worst or barycentric value in place of a slope, and therefore can optimize, for example, the depth of focus as well.

Variable parameters of an exposure apparatus, such as the illumination configuration (effective light source distribution), the numerical aperture (NA), the laser spectral distribution of a light source, the tilt or vibration of a mask stage, the aberration, and the pupil transmittance can be set as parameters of the exposure condition to be optimized. Also, the parameters of the mask pattern can include mask shape data such as the line width, the pitch, and the layout.

[First Embodiment]

The indices which did not reach a predetermined performance among combinations of the illumination configuration (exposure condition) and mask pattern, that are determined in the optimization method according to the prior invention, mainly include those associated with the line width error and image shift greatly influenced by the parameters of the mask pattern. See how the values indicated by square marks change in FIGS. 2A and 2D for details of this fact. For example, the worst value of the exposure margin depth of focus reached a value equal to or less than an allowable value of 250 nm (square marks in FIG. 2G), while the common exposure margin depth of focus did not reach a performance value equal to or less than an allowable value of 250 nm (square marks in FIG. 2F), because the line width error did not reach a performance value as small as an allowable value of 1%. Hence, in the first embodiment, a sequence of comprehensively evaluating and optimizing the parameters of the mask pattern and exposure condition using a plurality of indices (second evaluation function) of imaging performance includes a sequence of optimizing the parameters of the mask pattern, which exert a great influence on, for example, the line width error. A sequence of optimizing the parameters of the exposure condition and mask pattern using a second evaluation function will be referred to as a second optimization sequence hereinafter. Also, an optimization sequence of narrowing the ranges of values to be taken by the parameters of the mask pattern, which exert a great influence on the indices of imaging performance (first evaluation function), which could not reach allowable values, will be referred to as a first optimization sequence hereinafter. The second optimization sequence of optimizing the parameters of the exposure condition and mask pattern includes steps S101, S102, and S110 to S112 in FIG. 3, and is the same as the optimization sequence in the prior invention. The first optimization sequence as a feature of the method according to the present invention corresponds to a loop of steps S103 to S109, and is a sequence of narrowing the ranges of values to be taken by the parameters of the mask pattern, which exert a great influence on the indices of imaging performance (first evaluation function), which are hard to reach allowable values.

In step S101, a computer (or, for example, a CPU or an MPU) sets initial values for the parameters of the exposure condition and mask pattern (first step). In step S102, the computer sets initial values for the sensitivities of the indices to the parameters of the exposure condition and mask pattern. Values input by the user are used as the initial values of the sensitivities to be set. In step S103, the computer evaluates the line width error and the image shift (first evaluation function) in each evaluation portion. In step S106, the computer obtains the value of each index described by the first evaluation function, and calculates the sensitivity indicating the rate of change in each index with respect to the amount of change in parameter of the mask pattern, based on the amount of change in the obtained value of each index and the amount of change in parameter of the mask pattern. At this time, an allowable range is set for the sensitivity of each index, and the calculated sensitivity is corrected to a sensitivity which falls within the allowable range if it did not fall within the allowable range. This makes it possible to prevent the sensitivity of each index from becoming so low that the solution diverges due to too much change in variable, or from becoming so high that convergence of the solution delays due to too little change in the variable. If it is judged in step S104 that the repeat count is one, the computer cannot determine the sensitivity of each index, and therefore substitutes the initial value set in step S102 for the sensitivity of each index in step S105.

In step S107, the computer determines the parameters of the mask pattern to be evaluated next, from the sensitivity of each index to the parameters of the mask pattern calculated in step S105 or S106, and the difference of the index from its target value. Let P be the target value of each index, Y be the current value of the index, S be the sensitivity, and X1 be the parameter of the current mask pattern. Then, the parameter X2 of the next mask pattern is determined using:

$$X2=X1+(P-Y)/S$$

In step S109, that is, the last step of the first optimization sequence, the computer changes the parameters of the mask pattern to those determined in step S107, and repeats steps S103 to S107. Steps S103 to S107 correspond to the first optimization sequence which constitutes a second step of optimizing the parameters of the mask pattern without changing the parameters of the exposure condition to temporarily determine the parameters of the mask pattern. If the loop of steps S103 to S109 is repeated a predetermined number of times set in advance, or if the value of the first evaluation function has reached the allowable range, the process advances to step S110 of the second optimization sequence. In step S110, the computer calculates the value of the second evaluation function describing the sum of a plurality of indices defined as variables (third step).

In step S111, the computer judges whether to execute a process of repeating the loop of steps S103 to S109 (first optimization sequence) and step S110 using the parameters of the new exposure condition and mask pattern as initial values (fifth step). If it is judged in step S111 that the repeat count of steps S103 to S110 has not reached a predetermined number set in advance, and the value of the second evaluation function calculated in the latest step S110 has not reached an allowable range, the computer judges that the process of repeating steps S103 to S110 is to be executed. In step S112, the computer determines the parameters of the mask pattern and exposure condition to be evaluated next, from the sensitivity of each index to the parameters of the mask pattern and exposure condition, and the difference of the value of the second evaluation function from its target range. The computer changes the parameters of the mask pattern and exposure condition for use in calculation of the first evaluation function (fourth step). The computer executes a process of repeating steps S103 to S110 while changing the parameters of the exposure condition and mask pattern in step S112.

If it is judged in step S111 that the repeat count of step S110 has reached the predetermined number, or the value of the second function has reached the allowable range, the computer judges that the process of repeating steps S103 to S110 is not to be executed. In step S113, the computer determines, as parameters to be adopted, the parameters of the mask pattern temporarily determined the last time and those of the exposure condition changed the last time.

Referring to FIGS. 2A to 2G, circle marks indicate the results of the method according to the first embodiment. All the indices of imaging performance: the line width error, the minimum value of the NILS, the exposure margin, the image shift, the NILS depth of focus, the common exposure margin depth of focus, and the worst value of the exposure margin depth of focus shown in FIGS. 2A to 2G, respectively, achieved the target imaging performance shown in Table 1. This reveals that the performance of optimization that can be reached is improved by the method according to the first embodiment. Although the line width and the image shift are designated as important indices of the first evaluation function, the edge shift may be designated.

[Second Embodiment]

In the first embodiment, the indices which have especially insufficient performance to reach target ranges in the optimization method which uses only the second optimization sequence mainly included the line width error and the image shift greatly influenced by the parameters of the mask pattern. However, if the NILS that is an index greatly influenced by the exposure condition such as the effective light source, for example, has insufficient performance to reach a target range, but this problem can be solved by including the first optimization sequence of narrowing the ranges of the parameters of the exposure condition into the second optimization sequence. In the second embodiment, the parameters of the illumination configuration and mask pattern are optimized while intensively narrowing down the illumination configuration (effective light source distribution).

Figure 4:
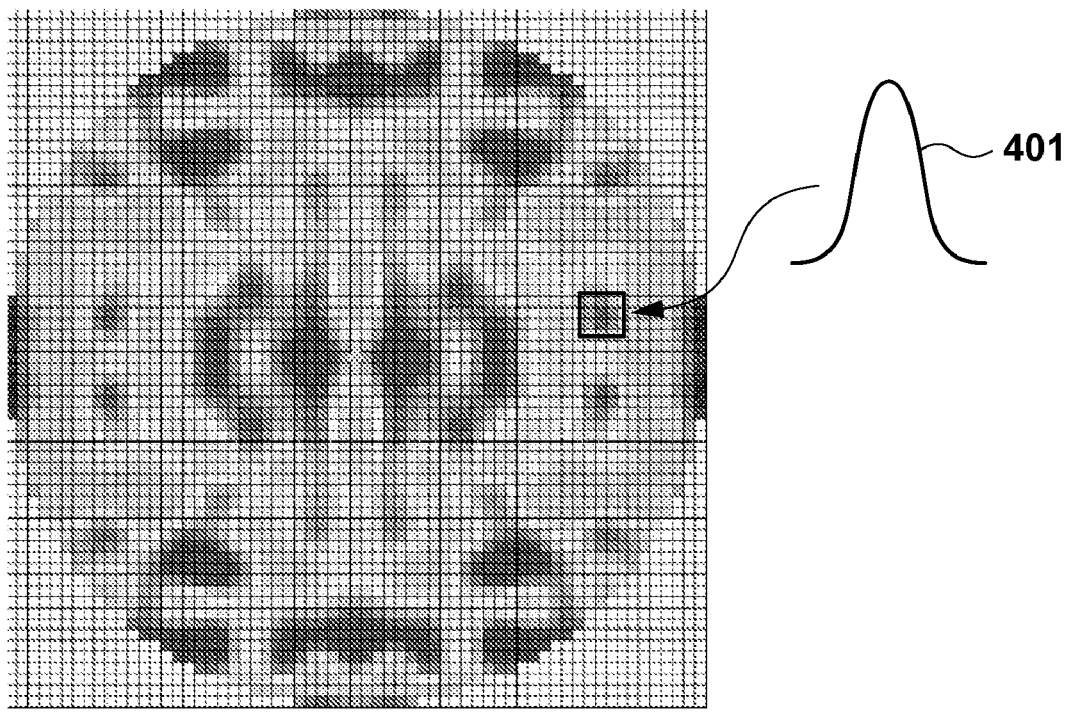
FIG. 4 is a view showing an effective light source.
Figure 5:
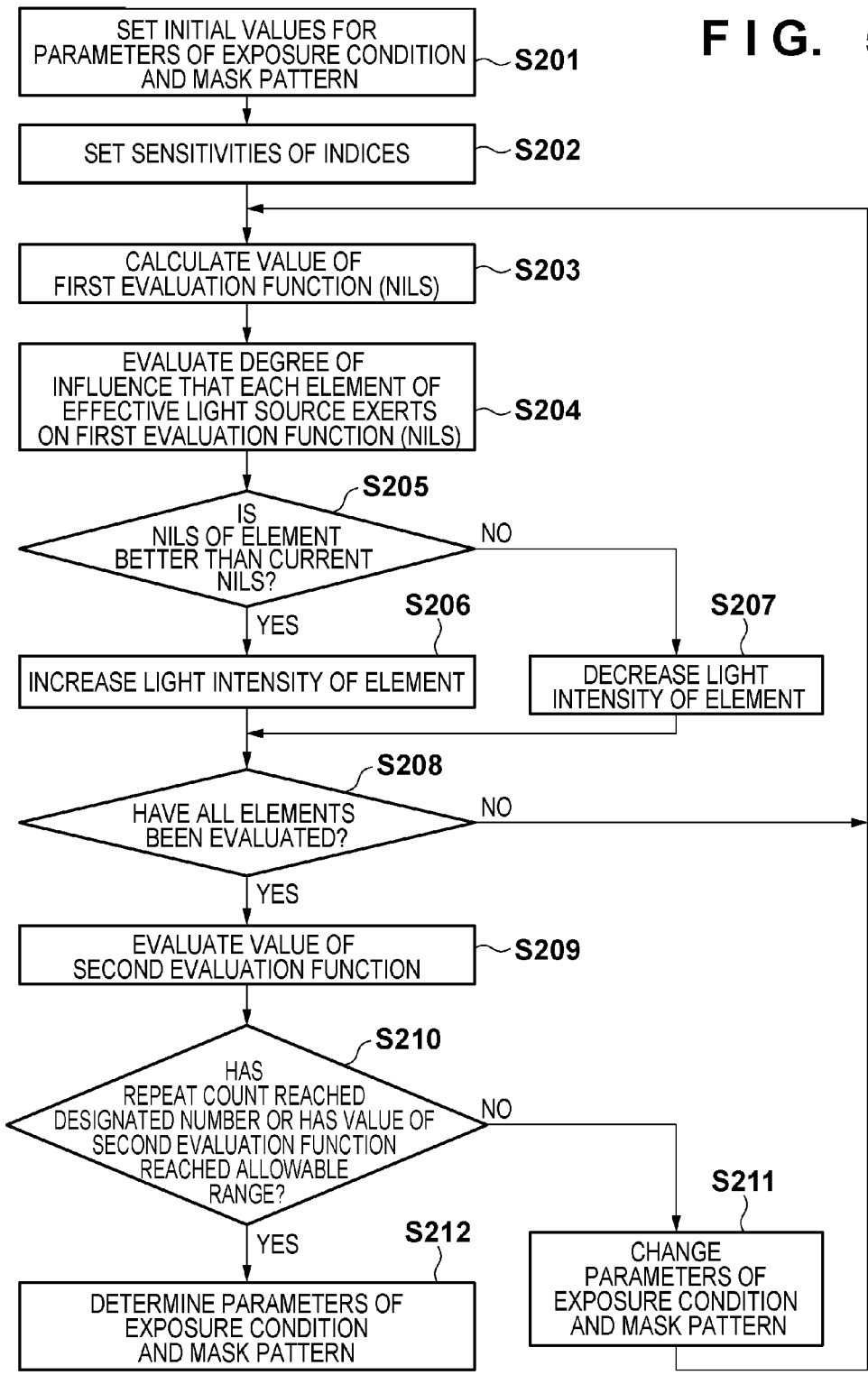
FIG. 5 is a flowchart of an optimization method according to the second embodiment.

In the second embodiment, an effective light source distribution represented by a Gaussian distribution 401 having a light intensity peak at the central position of each element obtained by equidistantly dividing the pupil, as shown in FIG. 4, is used. A method according to the second embodiment, which optimizes the parameters of the effective light source distribution and mask pattern while intensively bringing the effective light source distribution which exerts a great influence on the NILS close to its target value, will be described with reference to FIG. 5. Note that the variable takes a peak light intensity in each element of the effective light source. In this embodiment, the light intensity ranges from 0 to 1. Also, the standard deviation of the Gaussian distribution 401 is an effective light source sigma value of 0.08.

Steps S201 and S202 are the same as steps S101 and S102, respectively, in the first embodiment. In step S203, the computer calculates the NILS value in each evaluation portion as an index of a first evaluation function. In step S204, the computer evaluates the degree of influence that a light intensity distribution formed by each element of the effective light source exerts on the NILS. If the NILS value gets larger upon increasing the light intensity of the evaluated element, the computer increases the light intensity of this element in step S206. In contrast, if the NILS value gets smaller upon increasing the light intensity of the evaluated element, the computer decreases the light intensity of this element in step S207. The computer executes steps S203 to S207 for all elements, thereby narrowing down the effective light source distribution. Although the NILS is used as an index described by the first evaluation function in this embodiment, the image contrast or the exposure margin may be used. Steps S209 to S212 in the second embodiment are the same as steps S110 to S113, respectively, in the first embodiment, and a description thereof will not be given. However, in this embodiment, the line width error, the NILS, and the depth of focus are assumed as indices described by the second evaluation function.

Figure 6:
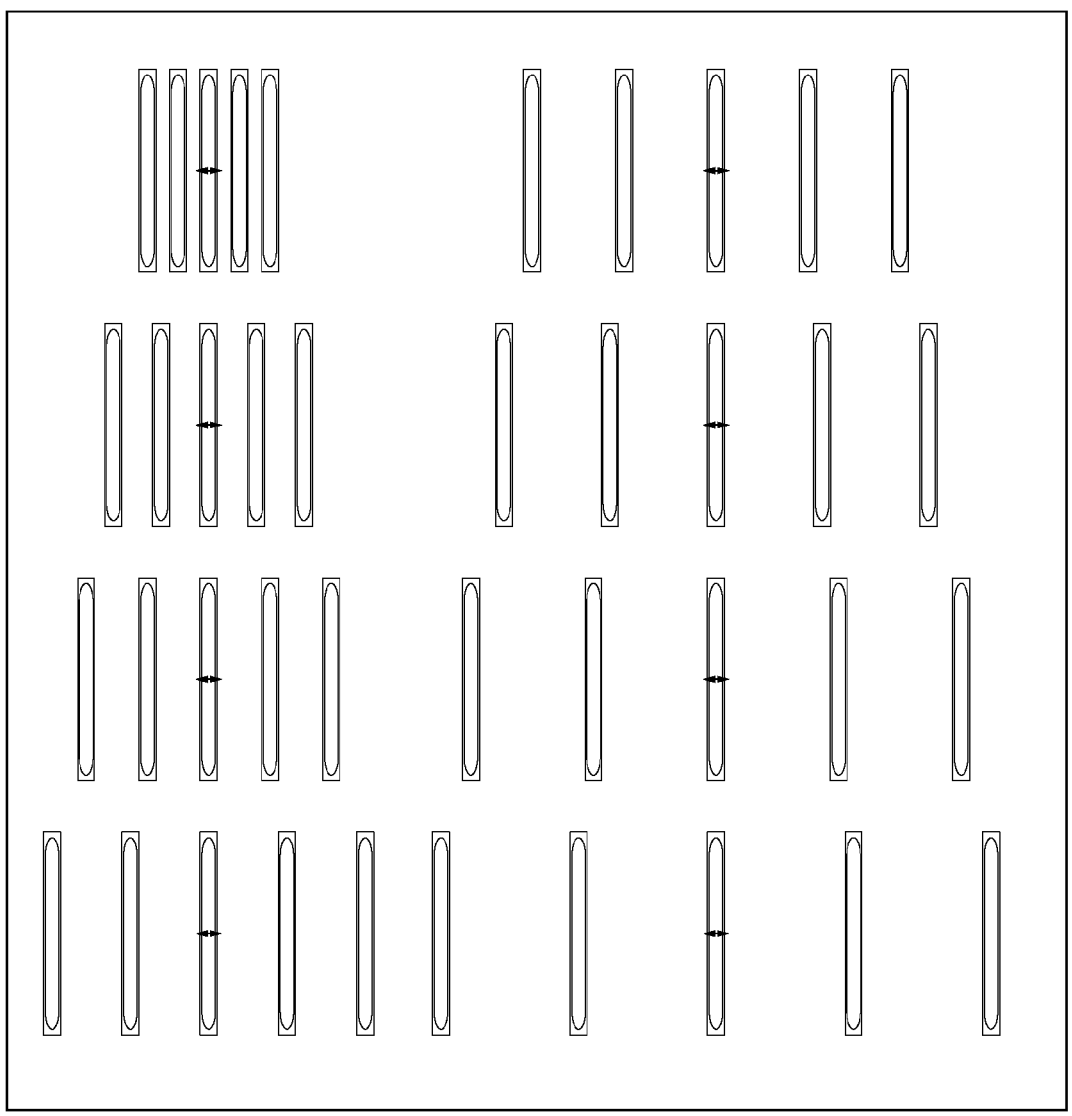
FIG. 6 is a view showing an evaluation pattern according to the second embodiment.
Figure 7A:
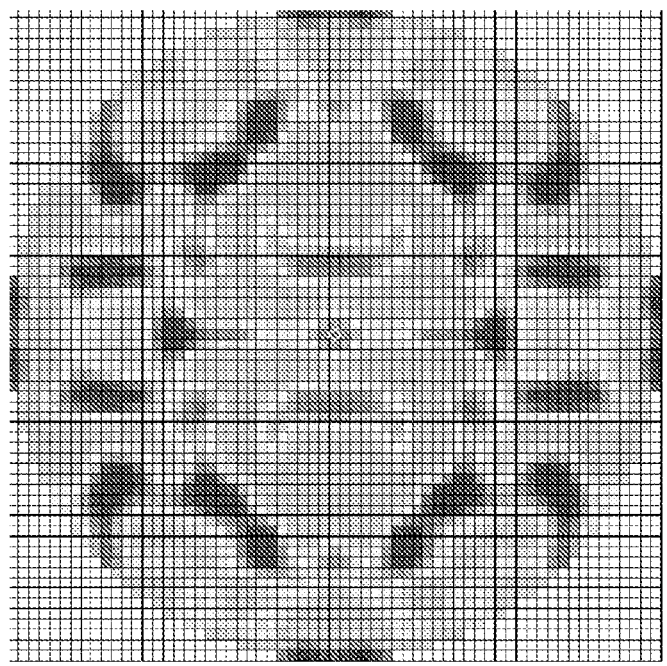
FIG. 7A is a view showing an effective light source distribution determined by the method according to the prior invention.
Figure 7B:
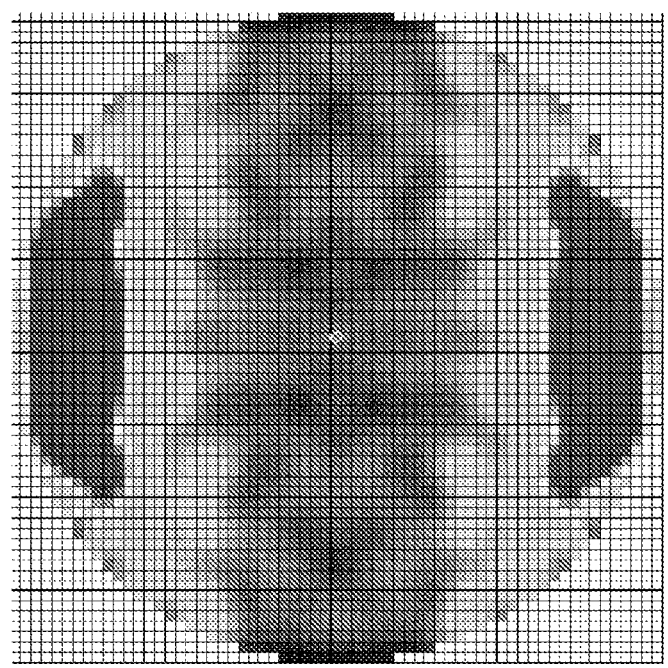
FIG. 7B is a view showing an effective light source distribution determined by the method according to the second embodiment.

In this embodiment, 90-nm line-and-space patterns having pitches of 180, 270, 360, 450, 540, 630, 720, and 810 nm were assumed as evaluation patterns, as shown in FIG. 6. Also, the effective light source distribution was optimized using masks having sizes of 70 to 150 nm on the scale of the image plane. FIG. 7A shows the effective light source distribution obtained by optimization using the method according to the prior invention, and FIG. 7B shows the effective light source distribution obtained by optimization using the method according to this embodiment. The effective light source distribution shown in FIG. 7A has relatively sparsely populated high-intensity regions, whereas the effective light source distribution shown in FIG. 7B has high-intensity regions densely populated at positions having relatively large σ values in the horizontal direction. Table 2 shows the results of optimization by the methods according to the prior invention and the second embodiment, respectively.

TABLE 2

|  | Conventional Method | Second Embodiment |
| --- | --- | --- |
| NILS worst (%) | 2.0 | 2.6 |
| CD RMS [nm] | 6.8 | 0.19 |
| ED RMS [nm] | 65 | 124 |

In both the methods according to the prior invention and the second embodiment, the line width error RMS, the NILS, and the depth of focus were used as parameters of a second evaluation function. However, in the method according to the prior invention, the NILS value did not reach a sufficient value, but nonetheless optimization was performed, so the NILS remained 2.0. On the other hand, in the method according to the second embodiment, the NILS value reached 2.6, and this means that an imaging performance better than the former was attained.

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium). In such a case, the system or apparatus, and the recording medium where the program is stored, are included as being within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-234915 filed Oct. 19, 2010, which is hereby incorporated by reference herein in its entirety.

What is claimed is:

1. A non-transitory program storage medium for causing a computer to execute a method of determining an exposure condition and a mask pattern used for an exposure apparatus which projects the mask pattern onto a substrate via a projection optical system to expose the substrate, the method including:
a first step of setting the exposure condition and the mask pattern;
a second step of temporarily determining the mask pattern using a first evaluation function describing indices of quality of an image of the mask pattern formed on the substrate by the projection optical system, using the exposure condition set in the first step;
a third step of calculating a value of a second evaluation function describing indices of quality of the image of the mask pattern formed on the substrate by the projection optical system, using the mask pattern temporarily determined in the second step, and the exposure condition set in the first step;
a fourth step of changing the exposure condition and the mask pattern based on the value of the second evaluation function calculated in the third step; and
a fifth step including a process of judging whether to execute a process of repeating the second step and the third step upon defining, as initial values, the exposure condition and the mask pattern changed in the fourth step,
wherein in the fifth step, if a repeat count of the second step and the third step has not reached a predetermined number, and the value of the second evaluation function calculated in the latest third step has not reached an allowable range, it is judged that the process of repeating the second step and the third step is to be executed; or if the repeat count of the second step and the third step has reached the predetermined number or the value of the second evaluation function calculated in the latest third step has reached the allowable range, it is judged that the process of repeating the second step and the third step is not to be executed, and the mask pattern temporarily determined in the latest second step, and the exposure condition changed in the latest fourth step are determined as the mask pattern and the exposure condition, respectively.

2. The non-transitory program storage medium according to claim 1, wherein
the second step includes:
a step of obtaining values of the indices described by the first evaluation function by changing the mask pattern;
a step of calculating a sensitivity indicating a rate of change in the obtained value of each of the indices with respect to an amount of change in the mask pattern, based on an amount of change in the obtained value of each of the indices, and the amount of change in the mask pattern; and
a step of determining the mask pattern to be evaluated next, from the calculated sensitivity of each of the indices, and a difference of the obtained value of each of the indices from a target value thereof.

3. The non-transitory program storage medium according to claim 2, wherein a value input by a user is set as an initial value of the sensitivity of each of the indices.

4. The non-transitory program storage medium according to claim 2, wherein if the sensitivity calculated in the step of calculating the sensitivity does not fall within an allowable value set in advance, the calculated sensitivity is corrected to a sensitivity which falls within the allowable range.

5. The non-transitory program storage medium according to claim 1, wherein optimization in the first step uses a downhill simplex method.

6. The non-transitory program storage medium according to claim 1, wherein
the first evaluation function includes a function having, as a variable, at least one of a line width error, an amount of shift in pattern, an amount of shift in pattern edge, and an NILS on an image plane of the projection optical system, and
the second evaluation function includes a function having, as a variable, at least one of the line width error, the amount of shift in pattern, the amount of shift in pattern edge, the NILS, a contrast of the image, a depth of focus, and an exposure margin on the image plane of the projection optical system.

7. A non-transitory program storage medium for causing a computer to execute a method of determining an exposure condition and a mask pattern used for an exposure apparatus which projects the mask pattern onto a substrate via a projection optical system to expose the substrate, the method including:
a first step of setting the exposure condition and the mask pattern;
a second step of temporarily determining the exposure condition using a first evaluation function describing indices of quality of an image of the mask pattern formed on the substrate by the projection optical system, using the mask pattern set in the first step;
a third step of calculating a value of a second evaluation function describing indices of quality of the image of the mask pattern formed on the substrate by the projection optical system, using the mask pattern set in the first step, and the exposure condition temporarily determined in the second step;
a fourth step of changing the exposure condition and the mask pattern based on the value of the second evaluation function calculated in the third step; and
a fifth step including a process of judging whether to execute a process of repeating the second step and the third step upon defining, as initial values, the exposure condition and the mask pattern changed in the fourth step,
wherein in the fifth step, if a repeat count of the second step and the third step has not reached a predetermined number, and the value of the second evaluation function calculated in the latest third step has not reached an allowable range, it is judged that the process of repeating the second step and the third step is to be executed; or if the repeat count of the second step and the third step has reached the predetermined number or the value of the second evaluation function calculated in the latest third step has reached the allowable range, it is judged that the process of repeating the second step and the third step is not to be executed, and the exposure condition temporarily determined in the latest second step, and the mask pattern changed in the latest fourth step are determined as the exposure condition and the mask pattern, respectively.

8. The non-transitory program storage medium according to claim 7, wherein
the second step includes:
a step of obtaining values of the indices described by the first evaluation function by changing the exposure condition;
a step of calculating a sensitivity indicating a rate of change in the obtained value of each of the indices with respect to an amount of change in the exposure condition, based on an amount of change in the obtained value of each of the indices, and the amount of change in the exposure condition; and a step of determining the exposure condition to be evaluated next, from the calculated sensitivity of each of the indices, and a difference of the obtained value of each of the indices from a target value thereof.

9. A method of determining, using a computer, an exposure condition and a mask pattern used for an exposure apparatus which projects the mask pattern onto a substrate via a projection optical system to expose the substrate, comprising:

a first step of setting the exposure condition and the mask pattern;

a second step of temporarily determining the mask pattern using a first evaluation function describing indices of quality of an image of the mask pattern formed on the substrate by the projection optical system, using the exposure condition set in the first step;

a third step of calculating a value of a second evaluation function describing indices of quality of the image of the mask pattern formed on the substrate by the projection optical system, using the mask pattern temporarily determined in the second step, and the exposure condition set in the first step;

a fourth step of changing the exposure condition and the mask pattern based on the value of the second evaluation function calculated in the third step; and a fifth step including a process of judging whether to execute a process of repeating the second step and the third step upon defining, as initial values, the exposure condition and the mask pattern changed in the fourth step, wherein in the fifth step, if a repeat count of the second step and the third step has not reached a predetermined number, and the value of the second evaluation function calculated in the latest third step has not reached an allowable range, it is judged that the process of repeating the second step and the third step is to be executed; or if the repeat count of the second step and the third step has reached the predetermined number or the value of the second evaluation function calculated in the latest third step has reached the allowable range, it is judged that the process of repeating the second step and the third step is not to be executed, and the mask pattern temporarily determined in the latest second step, and the exposure condition changed in the latest fourth step are determined as the mask pattern and the exposure condition, respectively, and wherein said steps are executed at least in part by the computer.

10. A method of determining, using a computer, an exposure condition and a mask pattern used for an exposure apparatus which projects the mask pattern onto a substrate via a projection optical system to expose the substrate, comprising:

a first step of setting the exposure condition and the mask pattern;

a second step of temporarily determining the exposure condition using a first evaluation function describing indices of quality of an image of the mask pattern formed on the substrate by projecting the mask pattern onto the substrate to expose the substrate under the exposure condition, using the mask pattern set in the first step;

a third step of calculating a value of a second evaluation function describing indices of quality of the image of the mask pattern formed on the substrate by the projection optical system, using the mask pattern set in the first step, and the exposure condition temporarily determined in the second step;

a fourth step of changing the exposure condition and the mask pattern based on the value of the second evaluation function calculated in the third step; and a fifth step including a process of judging whether to execute a process of repeating the second step and the third step upon defining, as initial values, the exposure condition and the mask pattern changed in the fourth step, wherein in the fifth step, if a repeat count of the second step and the third step has not reached a predetermined number, and the value of the second evaluation function calculated in the latest third step has not reached an allowable range, it is judged that the process of repeating the second step and the third step is to be executed; or if the repeat count of the second step and the third step has reached the predetermined number or the value of the second evaluation function calculated in the latest third step has reached the allowable range, it is judged that the process of repeating the second step and the third step is not to be executed, and the exposure condition temporarily determined in the latest second step, and the mask pattern changed in the latest fourth step are determined as the exposure condition and the mask pattern, respectively, and wherein said steps are executed at least in part by the computer.

* * * * *